(12) United States Patent
Koike et al.

(10) Patent No.: US 7,802,225 B2
(45) Date of Patent: Sep. 21, 2010

(54) OPTICAL PROXIMITY CORRECTION METHOD, OPTICAL PROXIMITY CORRECTION APPARATUS, AND OPTICAL PROXIMITY CORRECTION PROGRAM, METHOD OF MANUFACTURING SEMICONDUCTOR DEVICE, DESIGN RULE FORMULATING METHOD, AND OPTICAL PROXIMITY CORRECTION CONDITION CALCULATING METHOD

(75) Inventors: Kaoru Koike, Kanagawa (JP); Kohichi Nakayama, Kanagawa (JP)

(73) Assignee: Sony Corporation, Tokyo (JP)

( * ) Notice: Subject to any disclaimer, the term of this patent is extended or adjusted under 35 U.S.C. 154(b) by 244 days.

(21) Appl. No.: 12/026,604

(22) Filed: Feb. 6, 2008

(65) Prior Publication Data

US 2008/0263483 A1 Oct. 23, 2008

(30) Foreign Application Priority Data

Feb. 9, 2007 (JP) ............................. 2007-029967

(51) Int. Cl.
*G06F 17/50* (2006.01)
(52) U.S. Cl. ............................. 716/19; 716/20; 716/21; 438/14; 257/E21.525
(58) Field of Classification Search ............. 716/19–21; 438/14; 257/E21.525
See application file for complete search history.

(56) References Cited

U.S. PATENT DOCUMENTS

| | | | |
|---|---|---|---|
| 6,562,638 | B1 | 5/2003 | Balasinski et al. |
| 6,775,818 | B2 | 8/2004 | Taravade et al. |
| 7,139,996 | B2 | 11/2006 | Ohuma et al. |
| 7,266,801 | B2* | 9/2007 | Kotani et al. .................. 716/21 |
| 2006/0245636 | A1* | 11/2006 | Kitamura et al. ............ 382/149 |
| 2007/0001232 | A1* | 1/2007 | King et al. .................. 257/368 |
| 2007/0035716 | A1* | 2/2007 | Yoshii et al. .................. 355/77 |
| 2007/0238204 | A1* | 10/2007 | Kurihara et al. .............. 438/14 |

FOREIGN PATENT DOCUMENTS

| | | |
|---|---|---|
| JP | 2003-052512 | 6/2003 |
| JP | 2003-330162 | 11/2003 |

* cited by examiner

*Primary Examiner*—Naum B Levin
(74) *Attorney, Agent, or Firm*—Sonnenschein Nath & Rosenthal LLP

(57) ABSTRACT

In the present invention, there is provided an optical proximity correction method including steps of: extracting a gate length distribution of a gate from a pattern shape of the gate of a transistor to be formed on a wafer; calculating electric characteristics of the gate; determining a gate length of a rectangular gate having electric characteristics equivalent to the calculated electric characteristics; calculating a corrective coefficient for describing an associated relationship between a statistical value of the extracted gate length distribution and the determined gate length; extracting a gate length distribution of a gate of a transistor by printing the design pattern, and calculating a gate length distribution representative value from the statistical value of the gate length distribution using the calculated corrective coefficient; and correcting the design pattern so that the calculated gate length distribution representative value will be a specification value.

7 Claims, 11 Drawing Sheets

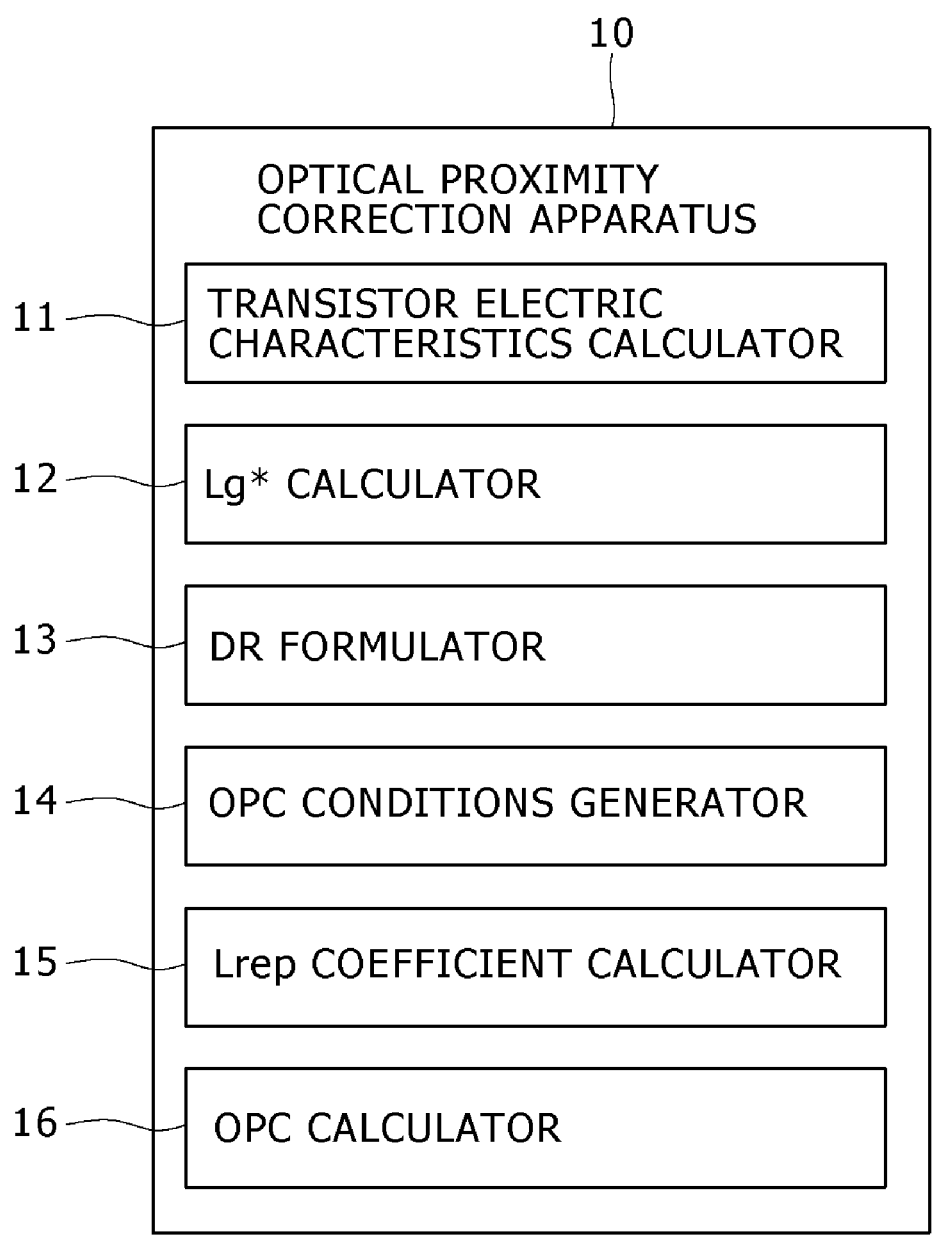

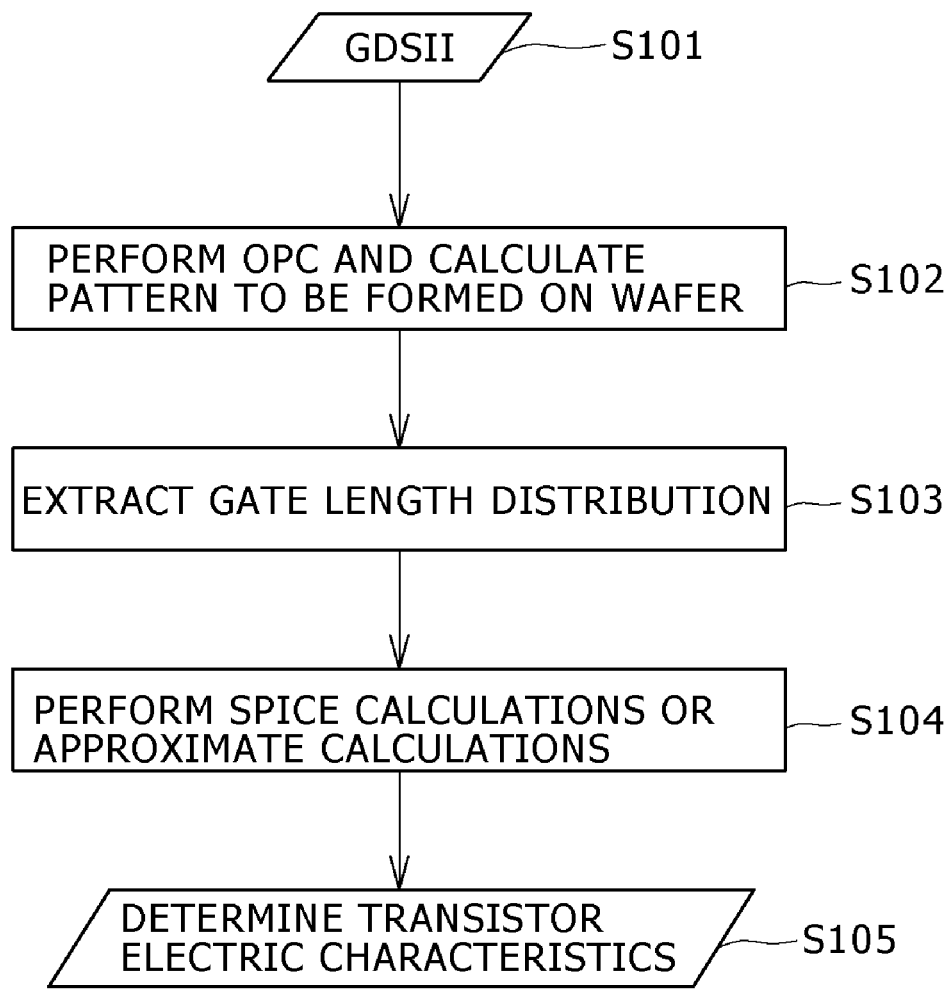

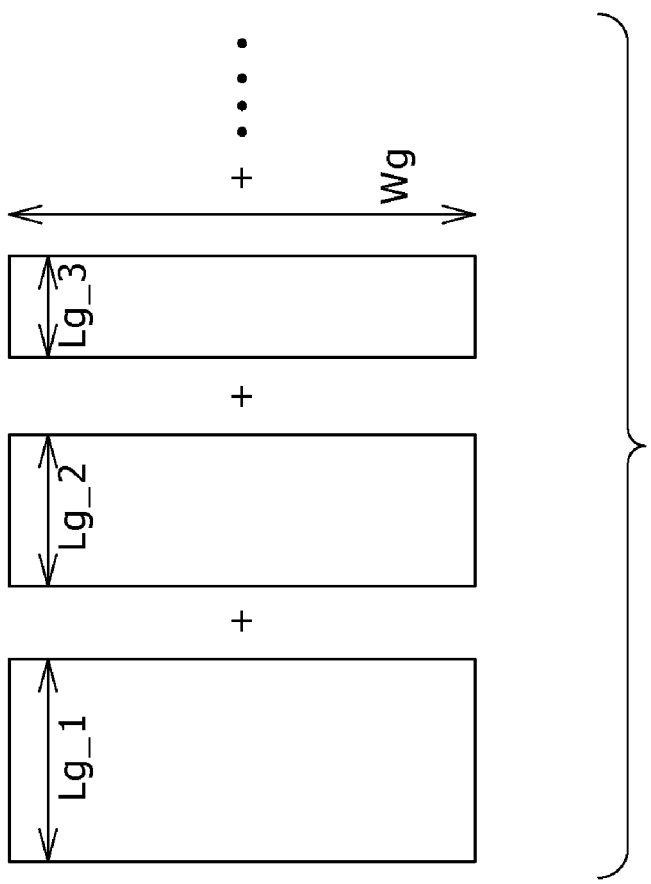
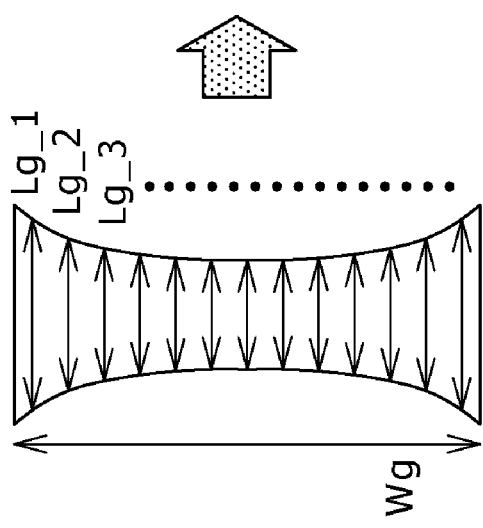

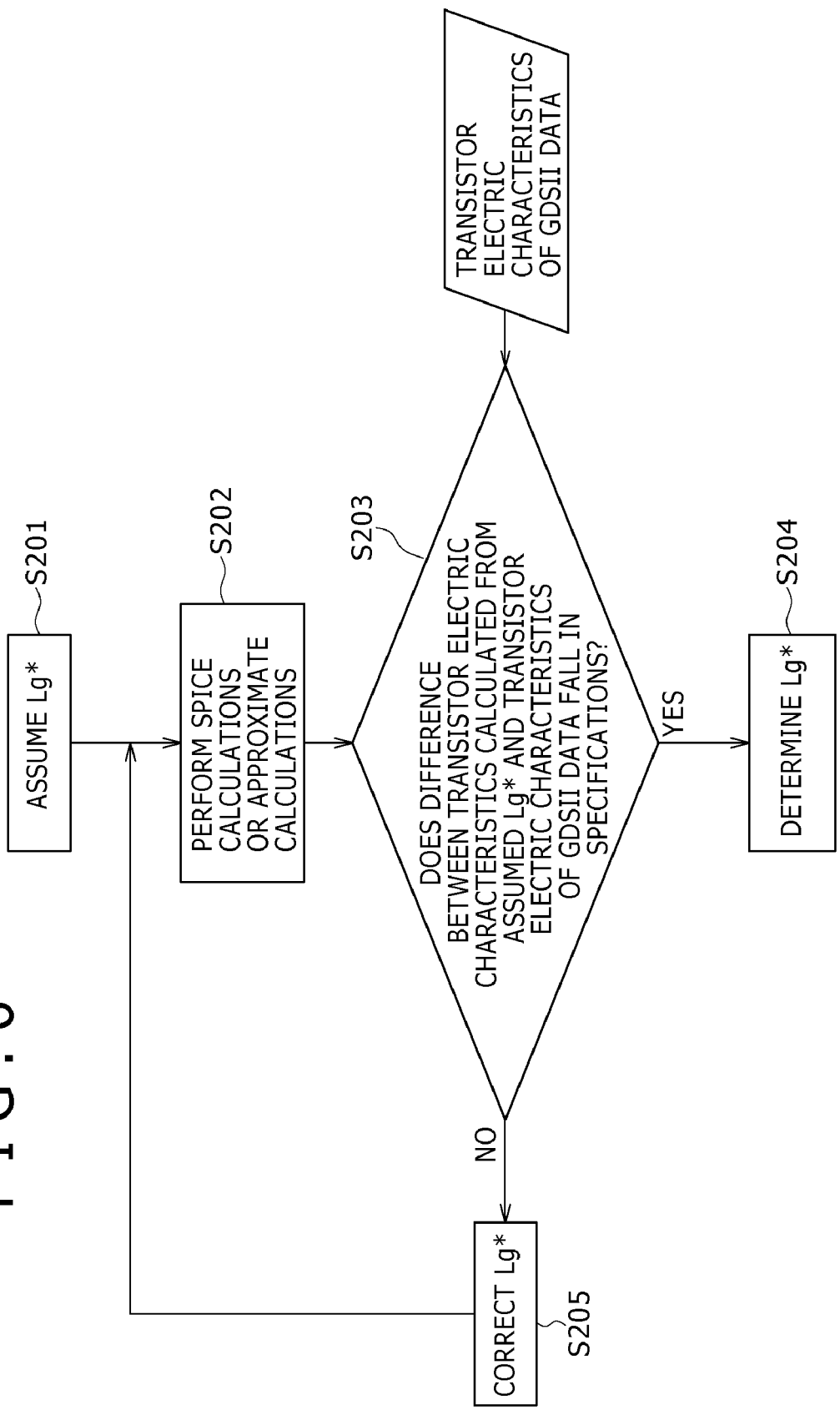

OPTICAL PROXIMITY CORRECTION METHOD, OPTICAL PROXIMITY CORRECTION APPARATUS, AND OPTICAL PROXIMITY CORRECTION PROGRAM, METHOD OF MANUFACTURING SEMICONDUCTOR DEVICE, DESIGN RULE FORMULATING METHOD, AND OPTICAL PROXIMITY CORRECTION CONDITION CALCULATING METHOD

CROSS REFERENCES TO RELATED APPLICATIONS

The present invention contains subject matter related to Japanese Patent Application JP 2007-029967 filed in the Japan Patent Office on Feb. 9, 2007, the entire contents of which being incorporated herein by reference.

BACKGROUND OF THE INVENTION

1. Field of the Invention

The present invention relates to an optical proximity correction method, an optical proximity correction apparatus, an optical proximity correction program, a method of manufacturing a semiconductor device, a design rule formulating method, and an optical proximity correction condition calculating method.

2. Description of the Related Art

Generally, a number of circuit elements are integrated in semiconductor devices. The most well known of those circuit elements is a transistor having a gate disposed between source and drain regions. Semiconductor devices having such a transistor as one of its components are manufactured by photolithography.

According to photolithography, as a circuit pattern to be formed on a wafer is smaller in size, it becomes more difficult to form a basic design pattern to desired shape and dimensions on the wafer. A process of correcting a mask shape for forming the basic design pattern to desired shape and dimensions on the wafer is called an optical proximity correction (hereinafter referred to as "OPC") process, which is indispensable in the modern lithographic technology. An OPC process for correcting a mask shape including process conversion differences due to various causes, which may also be called a PPC (Process Proximity Correction) process, is also used in the art.

The OPC process is carried out according to a sequence shown in FIG. 11 of the accompanying drawings. According to the OPC process, the data of a design pattern (e.g., data in GDSII format) and OPC conditions (e.g., calculating conditions for the OPC process) are read into an OPC tool (steps 702, 702, a step will hereinafter be abbreviated as "S"). Thereafter, the outer edge of a layout pattern of a circuit is divided into small pieces called segments (S703). An evaluating point (hereinafter referred to as "EP") representing a segment is set for each segment (S704). Segment positions on a pattern to be formed on a wafer are calculated by a simulation (S705), after which a variation of the calculated value of each segment from a target value (hereinafter referred to as "edge placement error" (EPE)) is calculate (S706). The shape of a mask pattern is modified, i.e., the segment positions are corrected, in order to keep the EPEs of all segments within specification values (S707, S708). Segment positions are calculated by iterative calculations to determine the shape of the mask pattern. In other words, the segment positions are changed in order to minimize the EPEs. The above OPC process is called model base OPC.

In the process of manufacturing semiconductor devices which have become more and more shrinking in recent years, it is very difficult to form a complete resist pattern according to a design pattern even through the OPC process, and the formed resist pattern tends to deform somewhat from the design pattern. Due to such a pattern deformation, semiconductor devices having a transistor as one of its components may have a transistor gate pattern distorted in two-dimensional directions within a plane. Such a gate pattern distortion greatly affects the electric characteristics of the transistor. It has therefore been proposed to focus attention on the electric characteristics of circuit elements for correcting mask patterns. (See, for example, Japanese laid-open No. 2003-330162, International publication No. 2003/052512 pamphlet, U.S. Pat. Nos. 6,562,638, and 6,775,818, hereinafter referred to as Patent Document 1, Patent Document 2, Patent Document 3, and Patent Document 4, respectively).

The related art referred to above suffers the following difficulties:

Patent document 1 discloses that electric characteristics of a semiconductor device with a transistor gate pattern distorted two-dimensionally are determined in advance and their correlation to the two-dimensional distortions is stored as a reference table, and that a gate length is determined in order to achieve desired electric characteristics. However, since Patent document 1 is silent about a process of quantitatively expressing two-dimensional gate pattern distortions, it is difficult to apply the disclosed process to actual semiconductor devices having various layouts.

Patent document 2 discloses that after a pattern processed by OPC is simulated by a simulating means to generate a print image of a gate pattern, it is determined whether a variation of the print image of the gate pattern from a design value for a certain gate length falls in an allowable range or not depending on demanded characteristics of a circuit, and if the variation does not fall in the allowable range, the edge of the pattern is shifted. If the demanded characteristics of the circuit are represented by a reduced leak current, then it is determined whether the minimum value of the gate length falls in an allowable range or not. If the demanded characteristics of the circuit are represented by an increased circuit performance, then the maximum value of the gate length is used. However, Patent document 2 fails to sufficiently show a process of setting the allowable range of the gate length. Therefore, the allowable range of the gate length is not related to the demanded characteristics of the circuit.

Patent document 3 reveals that a gate length distribution is extracted from a print image of a gate pattern, and electric characteristics of a circuit device are calculated from the extracted gate length distribution, after which a parametric yield of a semiconductor device is calculated from the distribution of the electric characteristics, and the gate pattern is corrected to keep the yield in a specification range. However, Patent document 3 lacks a specific description about how the pattern is to be corrected according to OPC, and is likely to suffer a heavy calculation load in calculating the electric characteristics of the circuit.

Patent document 4 discloses that depending on the shape of a simulated pattern to be printed to a wafer, electric characteristics of a transistor and wiring characteristics are calculated, and process conditions for fabricating semiconductor devices are corrected depending on those characteristics. However, Patent document 4 contains no description as to various characteristic changes due to two-dimensional printed pattern distortions that have been at issue in recent years. Therefore, the disclosed process is considered to have difficulty dealing with various characteristic changes.

SUMMARY OF THE INVENTION

There is a need for the present embodiment to provide an optical proximity correction method, an optical proximity correction apparatus, an optical proximity correction program, a method of manufacturing a semiconductor device, a design rule formulating method, and an optical proximity correction condition calculating method, which are capable of obtaining desired electric characteristics even if the gate pattern of a transistor of a semiconductor device is two-dimensionally distorted, and of making the calculation load imposed by calculating the electric characteristics smaller than with the related art.

According to an embodiment of the present invention, there is provided an optical proximity correction method of performing optical proximity correction on a design pattern for a semiconductor device including a transistor as a component thereof, including: a first step of extracting a gate length distribution of a gate from a pattern shape of the gate of a transistor to be formed on a wafer; a second step of calculating electric characteristics of the gate from which the gate length distribution has been extracted in the first step; a third step of determining a gate length of a rectangular gate having electric characteristics equivalent to the electric characteristics calculated in the second step; a fourth step of calculating a corrective coefficient for describing an associated relationship between a statistical value of the gate length distribution extracted in the first step and the gate length determined in the third step; a fifth step of extracting a gate length distribution of a gate of a transistor formed on the wafer by printing the design pattern, and calculating a gate length distribution representative value from the statistical value of the gate length distribution using the corrective coefficient calculated in the fourth step; and a sixth step of correcting the design pattern so that the gate length distribution representative value calculated in the fifth step will be a specification value.

According to the above optical proximity correction method, the gate length distribution representative value is calculated using the corrective coefficient from the statistical value of the gate length distribution of the gate of the transistor to be formed on the wafer. The statistical value of the gate length distribution may be an average value, a median value, a variation value (standard deviation or the like), a minimum value, a maximum value, or a mode value of a plurality of different gate length distributions due to a two-dimensional distortion on the wafer. The gate length distribution allows the two-dimensional distortion on the gate of the wafer to be expressed quantitatively. The associated relationship described by the corrective coefficient is based on the electric characteristics of the gate, or specifically, at least one of a threshold voltage, a drive current, and a leakage current of the gate. The gate length distribution representative value calculated using the corrective coefficient is simulated as a representative value of the gate lengths of the gate which provides electric characteristics equivalent to those of the gate on the wafer which is suffering the two-dimensional distortion. Therefore, if the design pattern is corrected so that the gate length distribution representative value will be a specification value, then a gate formed on the wafer after the pattern is corrected has electric characteristics corresponding to the specification value, i.e., desired electric characteristics. In addition, the gate length distribution representative value is calculated using the corrective coefficient. In other words, if the corrective coefficient has been calculated, then since the gate length distribution representative value is calculated using the corrective coefficient, the calculation load imposed for calculating the gate length distribution representative value is prevented from becoming excessively large.

According to an embodiment of the present invention, even if a gate pattern for a transistor of a semiconductor device is two-dimensionally distorted, the transistor is able to have desired electric characteristics. Consequently, even in situations where it is difficult to form a gate pattern to desired shape and dimensions because circuit patterns are more and more shrinking, the electric characteristics of transistors are prevented from being degraded. As the calculation load is prevented from becoming excessively large, but can be made smaller than heretofore, a process including the calculation load can be made faster.

BRIEF DESCRIPTION OF THE DRAWINGS

FIG. 2 is a block diagram of an optical proximity correction apparatus for performing an OPC process;

FIG. 3 is a flowchart of a sequence for calculating the electric characteristics of a transistor;

FIGS. 4A and 4B are diagrams showing a specific example of a process of calculating electric characteristics;

FIG. 6 is a flowchart of a sequence for calculating Lg*;

DETAILED DESCRIPTION OF THE PREFERRED EMBODIMENT

An optical proximity correction method, an optical proximity correction apparatus, an optical proximity correction program, a method of manufacturing a semiconductor device, a design rule formulating method, and an optical proximity correction condition calculating method according to the present embodiment will be described in detail below with reference to the accompanying drawings.

[Semiconductor Device]

A semiconductor device which is handled by the present embodiment will first briefly be described below. The semiconductor device which is handled by the present embodiment includes a transistor as a component thereof.

Figure 1:
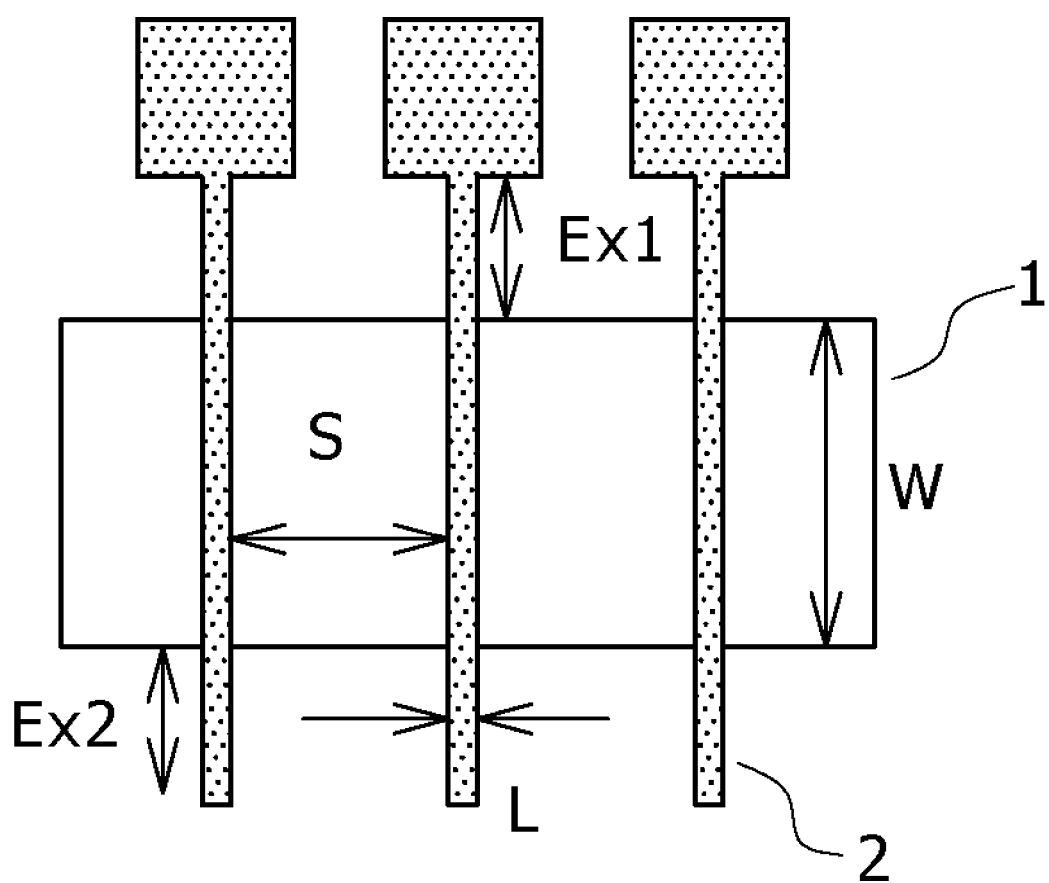
FIG. 1 is a plan view showing a specific example of the gate pattern of a transistor.

FIG. 1 is a plan view showing a specific example of the gate pattern of a transistor. As shown in FIG. 1, the transistor has a source/drain region 1 and gate layers 2 overlying the source/drain region 1. The areas where gate layers 2 overlie the source/drain region 1 function as gates. The gate length (the size of each gate along its transverse direction) L and the gate width (the length functioning as a gate) W directly affect electric characteristics of the gate, or specifically a threshold voltage, a drive current, a leakage current, etc.

A semiconductor device having such a transistor as a component is fabricated according to the photolithographic technology, i.e., by a lithographic process for printing a gate pattern onto a wafer.

An exposure apparatus for forming a gate pattern according to the lithographic process may be an ArF excimer laser stepper (wavelength: 193 nm, NA: 0.75, σ: 0.3, magnification: 4 times). An exposure mask may be an alternating phase-shifting mask. However, the exposure apparatus and the exposure mask are not limited to the above types, but may be other designs.

According to the photolithographic technology, as described above, as circuit patterns to be formed on wafers become more and more shrinking, it is very difficult to produce desired pattern shapes and pattern dimensions on wafers even through the OPC process. For example, when a transistor is to be formed on a wafer, the gate may suffer a two-dimensional distortion, typically a fluctuation of the gate length L.

In order to avoid the above difficulty, an OPC process to be described below is carried out prior to the printing of a gate pattern onto a wafer. After the mask pattern of an exposure mask is formed to a mask shape corrected by the OPC process, a gate pattern is printed onto a wafer using the exposure mask.

[General Makeup of Optical Proximity Correction Apparatus and Optical Proximity Correction Program]

FIG. 2 is a block diagram of an optical proximity correction apparatus 10 for performing an OPC process. As shown in FIG. 2, the optical proximity correction apparatus 10 has functions as a transistor electric characteristics calculator 11, an Lg* calculator 12, a DR formulator 13, an OPC conditions generator 14, an Lrep coefficient calculator 15, and an OPC calculator 16.

The optical proximity correction apparatus 10 thus constructed may be in the form of a computer apparatus including a personal computer or a mask pattern forming apparatus or a mask pattern correcting apparatus having a function as a computer. The above functional components 11 through 16 are realized when the computer of the optical proximity correction apparatus 10 executes a predetermined program. The predetermined program may be stored in and provided by a computer-readable storage medium before the program is installed in the optical proximity correction apparatus 10. Alternatively, the predetermined program may be distributed to the optical proximity correction apparatus 10 via a wired or wireless communicating means. Stated otherwise, the functions of components 11 through 16 are realized by an optical proximity correction program that can be installed into the computer.

The functions of components 11 through 16 of the optical proximity correction apparatus 10 and processing sequences of the functions will be described below.

[Calculations of Electric Characteristics of Transistor]

FIG. 3 is a flowchart of a processing sequence of the transistor electric characteristics calculator 11, i.e., a sequence for calculating the electric characteristics of a transistor.

For calculating the electric characteristics of a transistor, the design shape data of the transistor are prepared in S101. The design shape data may, but not necessarily, be data in a GDSII format (hereinafter referred to as "GDSII data"). The GDSII data to be prepared may be data of a transistor making up an actual semiconductor device or data of a test pattern having a certain shape insofar as the data are descriptive of a layout for producing a transistor.

When the GDSII data are entered into the transistor electric characteristics calculator 11, the transistor electric characteristics calculator 11 performs a known OPC process on a layout pattern specified by the GDSII data, determines a mask pattern corresponding to the layout pattern according to simulating calculations, and determines a pattern to be formed on a wafer according simulating calculations for printing the mask pattern onto the wafer and processing the assembly, in S102. After the pattern to be formed on the wafer has been determined, the transistor electric characteristics calculator 11 extracts gate lengths L of a portion of the pattern which will serve as the gate of the transistor at given intervals along the direction of the gate width W in S103. In other words, the transistor electric characteristics calculator 11 extracts a distribution of the gate lengths L along the direction of the gate width W. The transistor electric characteristics calculator 11 may extract the gate lengths L according to a known process such as an EDA (Electronic Design Automation) tool, for example.

After the transistor electric characteristics calculator 11 has extracted the gate length distribution, the transistor electric characteristics calculator 11 calculates electric characteristics of the portion of the pattern which will serve as the gate of the transistor, i.e., the gate portion from which the gate length distribution has been extracted, in S104, S105. The electric characteristics include a gate threshold voltage Vth, a drive current Ion, and a leakage current Ioff as they are particularly important among various electric characteristics of the transistor. However, the electric characteristics to be calculated are not limited to those specified electric characteristics.

The electric characteristics may be calculated as follows:

FIGS. 4A and 4B are diagrams showing a specific example of a process of calculating electric characteristics. When a gate length distribution is extracted, a plurality of gate lengths Lg_1, Lg_2, Lg_3 . . . extracted at given intervals are obtained, as shown in FIG. 4A. Then, rectangular transistor gate portions, each having a constant gate length, are assumed with respect to the respective gate lengths Lg_1, Lg_2, Lg_3 . . . as shown in FIG. 4B. Electric characteristics of the respective assumed gate portions are calculated, and average values of the calculated electric characteristics are used as electric characteristics the original gate portion from which the gate length distribution has been extracted. In this manner, electric characteristics of a gate depending on the shape of the pattern formed on the wafer are calculated. The electric characteristics of the rectangular transistor gate portions may be calculated by a known process such as SPICE which can design an electric circuit on a computer and observe changes in voltages and currents in the operation of the electric circuit. The known process includes approximate calculations. Specifically, the relationship between gate lengths and electric characteristics may be calculated by SPICE and approximated by a function involving a small computational effort such as a linear polynomial or the like.

Figure 5A:
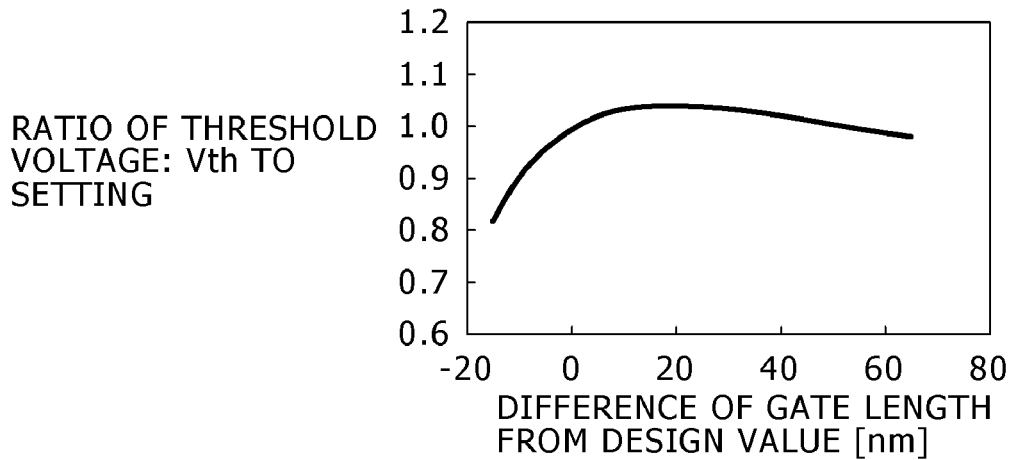
FIGS. 5A through 5C are diagrams showing the relationship between gate lengths and electric characteristics.
Figure 5B:
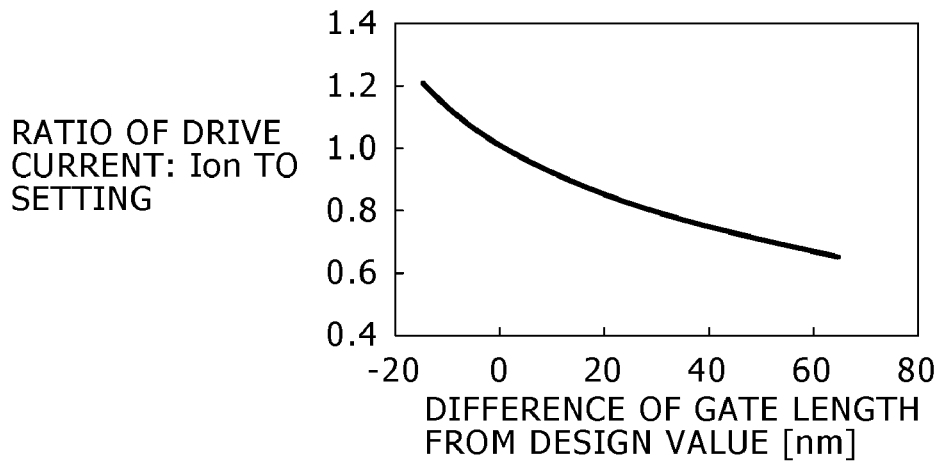
Figure 5C:
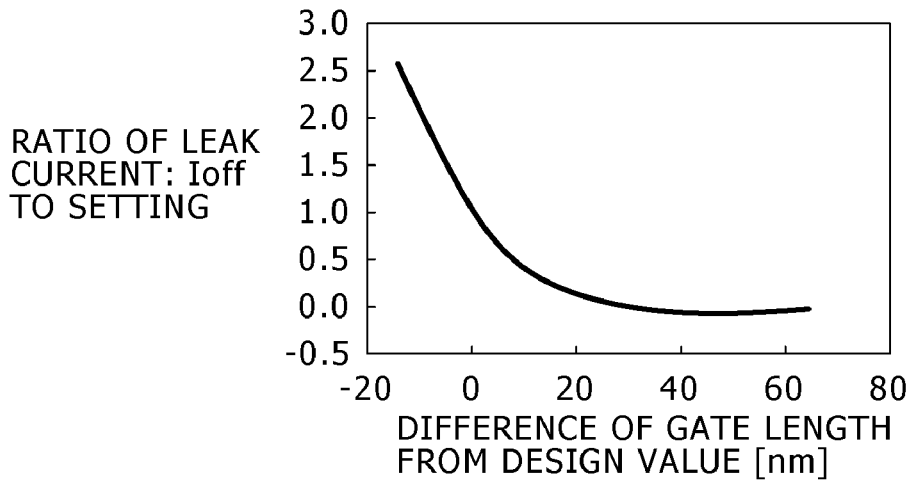

FIGS. 5A through 5C are diagrams showing the relationship between gate lengths and electric characteristics. As shown in FIGS. 5A through 5C, if the electric characteristics including Vth (see FIG. 5A), Ion (see FIG. 5B), and Ioff (see FIG. 5C) are calculated by SPICE, for example, then the relationship between the electric characteristics and the gate lengths, or more specifically, differences of the gate lengths from design values, can be calculated in advance. Though the relationship between gate lengths and electric characteristics can be approximated by a function such as a linear polynomial or the like, different formulas are demanded for Vth, Ion, and Ioff, respectively.

[Calculation of Lg*]

FIG. 6 is a flowchart of a processing sequence of the Lg* calculator 12, i.e., a sequence for calculating Lg*.

"Lg*" represents the gate length of a rectangular gate having electric characteristics equivalent to the electric characteristics (with respect to the gate with the distorted two-dimensional shape on the wafer) calculated by the above calculations of the electric characteristics of the transistor. With Lg* being determined, the transistor having the gate with the distorted two-dimensional shape can be replaced with a transistor having a rectangular gate with equivalent electric characteristics.

For calculating Lg*, the Lg* calculator 12 assumes a certain value to be an initial value of Lg* in S201, and the Lg* calculator 12 determines electric characteristics of a rectangular gate with the initial value of Lg* in S202. The electric characteristics are determined identically to the electric characteristics determined by the above calculations. For example, if Vth is selected as the electric characteristics of the transistor, then Vth is determined in calculating Lg*. If Vth, Ion, and Ioff are selected as the electric characteristics of the transistor, then Vth, Ion, and Ioff are determined in calculating Lg*. The electric characteristics may be determined by the same process as used by the calculations of the electric characteristics of the transistor.

After the electric characteristics of the rectangular gate have been calculated, the Lg* calculator 12 compares the calculated electric characteristics with the electric characteristics calculated by the above calculations of the electric characteristics of the transistor, and determines whether the difference between the electric characteristics matches preset specifications or not, i.e., falls in an allowable range or not, in S203. If the difference falls in the allowable range, then the Lg* calculator 12 sets the assumed initial value as Lg* of the transistor whose electric characteristics are equivalent to those of the transistor having the gate with the distorted two-dimensional shape, in S204. If the difference falls out of the allowable range, then the Lg* calculator 12 changes the assumed initial value according to a given rule in S205, recalculates electric characteristics based on the corrected value of Lg*, and repeats the loop (S202 through S205) until the difference between the recalculated electric characteristics and the electric characteristics calculated by the above calculations of the electric characteristics of the transistor falls in the allowable range. Though the number of iterations which the loop goes through is not specified here, the Lg* calculator 12 shall operate according to an algorithm, which iterative calculation processes of this type usually have, for calculating electric characteristics within a preset number of iterations.

[Formulation of DR]

"DR" represents a design rule, or more specifically, a design rule based on lithography and semiconductor fabrication processes, i.e., various limitations on the layout of circuit patterns.

It is the general practice to determine DR based on lithography and semiconductor fabrication processes with respect to dimensions of a minimum pattern that can be formed on wafers. However, in view of the fact that patterns formed on wafers are two-dimensionally distorted and electric characteristics of the gates of fabricated transistors are degraded by the two-dimensional distortion, the DR based on lithography and semiconductor fabrication processes should be formulated also taking into account the electric characteristics.

Therefore, the DR formulator 13 performs a processing sequence, to be described below, to formulate DR taking into account electric characteristics.

Figure 7:
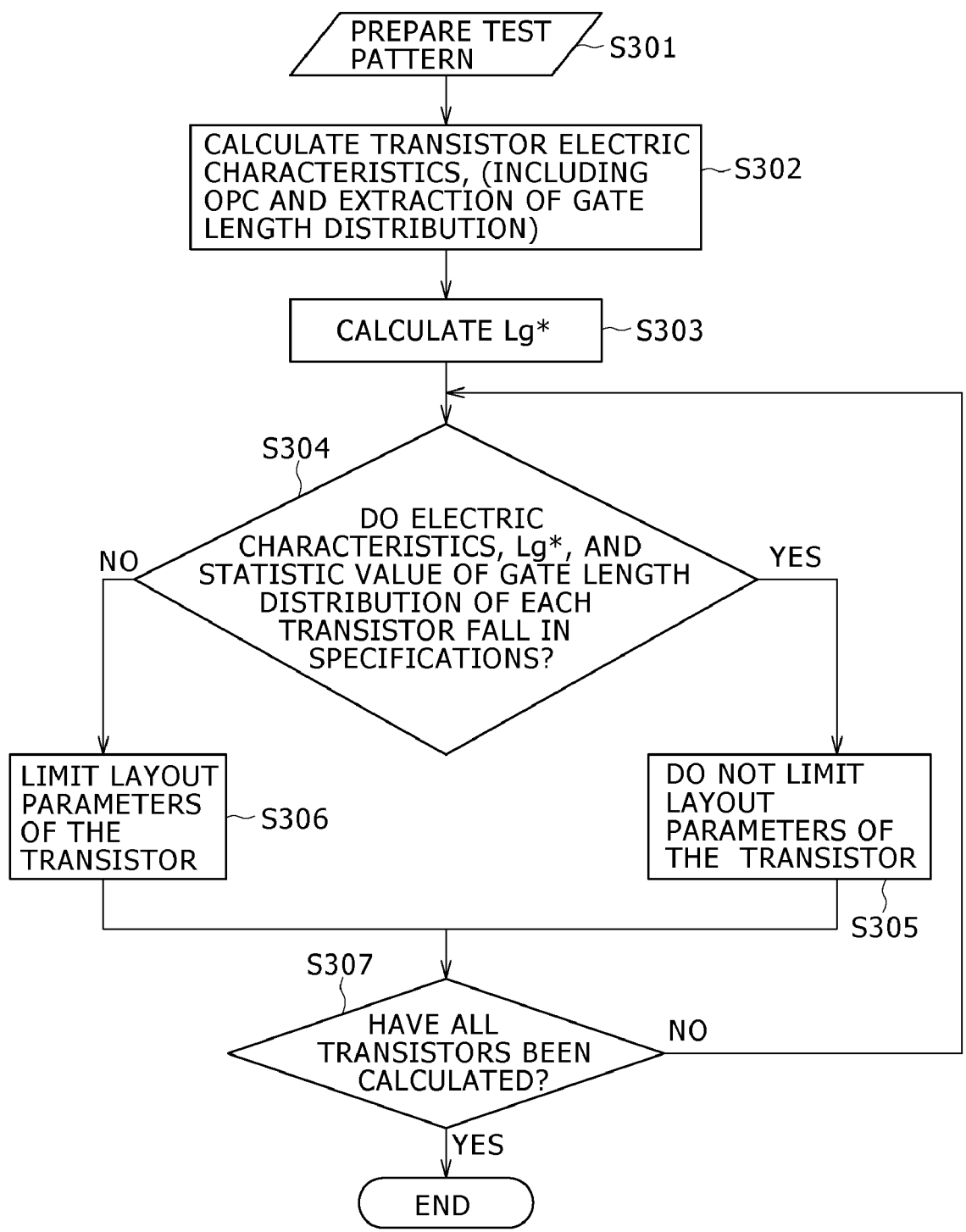
FIG. 7 is a flowchart of a sequence for formulating DR.

FIG. 7 is a flowchart of a processing sequence of the DR formulator 13, i.e., a sequence for formulating DR.

For formulating DR, a test pattern of DR items to be formulated, i.e., layout parameters, sorted into ranges to be considered is prepared in S301. The DR items (layout parameters) include the gate width W, the gate-to-gate distance S, and the size of an area where the contact holes and the gate pattern overlap each other (see FIG. 1). The gate width W, for example, may be sorted into ranges of 100 nm from 100 nm to 1000 nm.

After the test pattern has been prepared, the DR formulator 13 predicts, by way of simulation, a shape to which the test pattern will be formed on a wafer, calculates electric characteristics of all transistors included in the test pattern, extracts a gate length distribution from a gate, and calculates electric characteristics of the gate from which the gate length distribution is extracted in S302. Then, the DR formulator 13 calculates Lg* and determines Lg* with equivalent electric characteristics in S303. When the gate length distribution is extracted, since a plurality of gate lengths are obtained from each gate, a statistical value of the gate lengths is determined. The statistical value of the gate lengths may be an average value, a median value, a variation value (standard deviation or the like), a minimum value, a maximum value, or a mode value of a plurality of gate length distributions.

After having determined the electric characteristics, the Lg* with equivalent electric characteristics, and the statistical value of the gate length distributions for each of the transistors included in the test pattern, the DR formulator 13 compare them with predetermined specification values and determine whether they satisfy the specification values or not in S304. If they satisfy the specification values, then the DR formulator 13 allows the layout parameters of the transistor to be used without being limited when a semiconductor device is designed, in S305. If they do not satisfy the specification values, then the DR formulator 13 sets the layout parameters of the transistor as DR, i.e., limits the layout parameters against use when a semiconductor device is designed, in S306.

The above loop (S304 through S307) is repeated until the process in those steps is finished on all the transistors included in the test pattern, i.e., all the layout parameters. In this manner, DR is formulated in view of the electric characteristics of a transistor.

The specification values to be compared in the above process may be determined depending on details of a process for fabricating individual semiconductor devices, e.g., the numerical aperture (NA) of the exposure apparatus, the processing conversion difference of the etching apparatus, etc. Different types of semiconductor devices such as DRAMs, high-performance CPUs, etc. have different electric characteristics to be determined. The specification values may also be determined in view of those different electric characteristics.

Specific examples of specification values will be described below. A specification example using a statistical value of gate length distributions may be such that a maximum value of gate length distributions will not exceed twice a design gate length and a minimum value of gate length distributions will not be smaller than a design gate length by 5 nm. A specification example using electric characteristics may be such that Ion will not be smaller than a target value by 5% or more and Ioff will not be greater than a target value by 20% or more. A specification example using Lg* may be such that each of threshold voltage Lg*_Vth, drive current Lg*_Ion, and leakage current Lg*_Ioff of a rectangular gate having a gate length of Lg* will not differ from its average value by 2 nm or more, and the average value will not differ from a target value by 2 nm or more. These specifications may be combined with each other and may be processed by a logical operation. The above numerical values are given by way of example only, and should be adjusted in actual use depending on semiconductor device fabrication processes and circuit characteristics of semiconductor devices.

Specifications for use in formulating DR may also be prepared as follows: As described in detail later, the OPC process performed by the OPC calculator 16 acts to reduce variations of the electric characteristics of a transistor. Therefore, specifications for use in the process of formulating DR which is performed by DR formulator 13 should also preferably be carried out on the premise of the OPC process performed by the OPC calculator 16. Specifically, a transistor as a whole is offset so that Lg* thereof will be of a certain constant value, and DR should be formulated depending on whether a statistical value of gate length distributions, electric characteristics, and Lg* after the transistor has been offset fall in the specifications described above or not. Specifically, attention is given to a variation of Vth as electric characteristics, and the transistor is offset so that Lg*_Vth of a rectangular gate having a gate length of Lg* will be a target gate length. According to a numerical example, if a target gate length for a transistor is 40 nm and Lg*_Vth is calculated as 43.2 nm, then 3.2 nm is subtracted from all gate lengths extracted from the transistor, and a statistical value of gate length distributions, electric characteristics, and Lg* are recalculated, and DR is calculated depending whether they satisfy the specifications or not.

In other words, an offset for equalizing Lg* to the target gate length is determined and applied to gate length distributions, after which a statistical value of gate length distributions, electric characteristics, and Lg* are calculated with respect to gate length distributions to which the offset has been applied, and DR is formulated from the calculated results. In this manner, the DR formulation becomes adapted to the OPC process performed by the OPC calculator 16, i.e., becomes appropriate for reducing variations in the electric characteristics of the transistor.

For determining an offset, a plurality of types of Lg* may be used. If a plurality of types of Lg* are used, then an offset length may be determined using an average value of types of Lg* or some calculations. If a plurality of types of values are used, then respective specifications may be determined and logic operations may be performed on respective design rule conditions, or a new evaluative index may be calculated using the types of values.

[Generation of OPC Conditions]

"OPC conditions" refer to corrective operating conditions for performing OPC on a design pattern for a semiconductor device. More specifically, it defines the sizes of segments for OPC, conditions for placing segments, the number of EPs for each segment, where an EP is to be placed in a segment, the size of an allowable EPE, etc.

For performing an OPC process, it is necessary to specify OPC conditions in advance. OPC conditions are specified, i.e., OPC conditions are generated, when the OPC conditions generator 14 perform a processing sequence to be described below.

Figure 8:
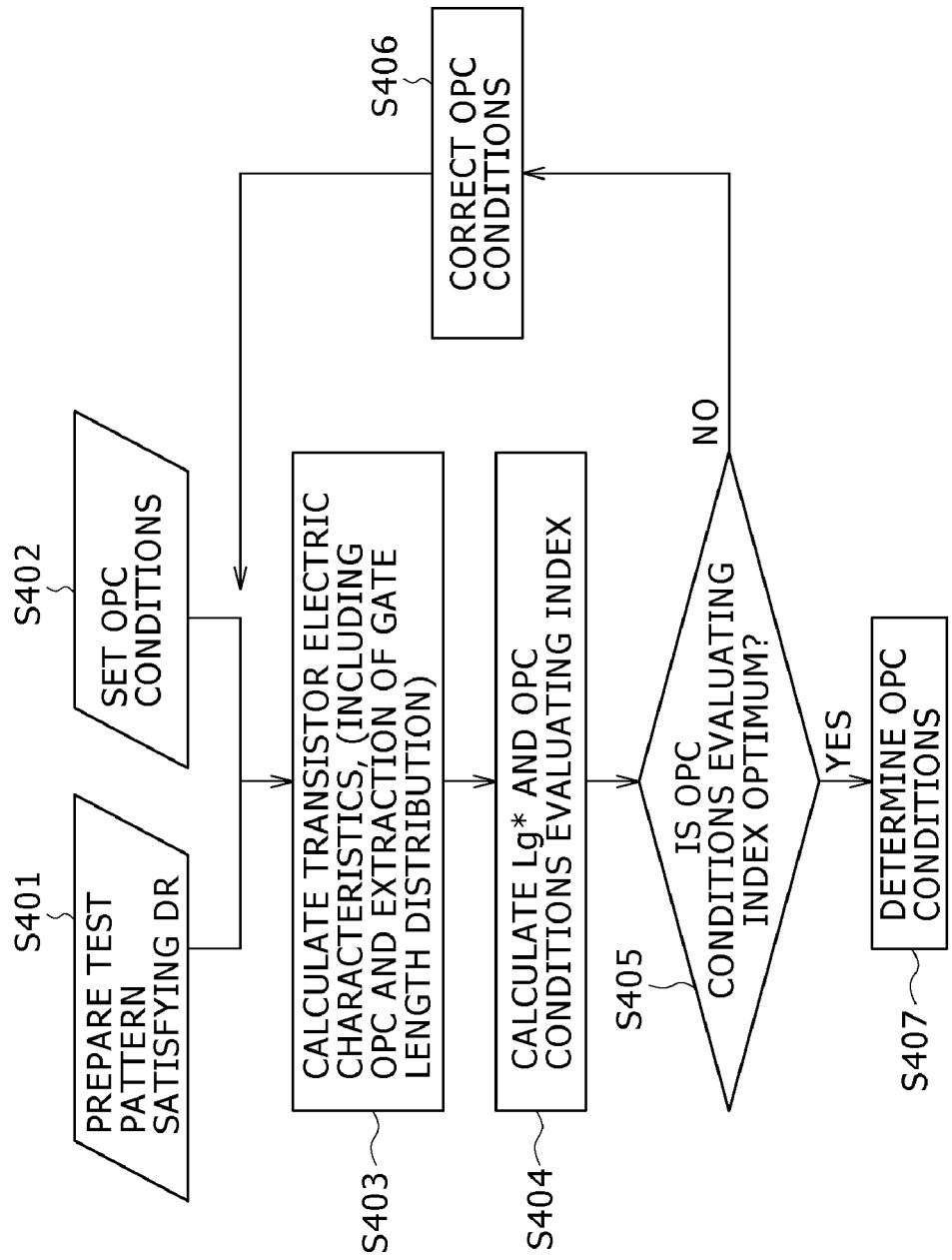
FIG. 8 is a flowchart of a sequence for generating OPC conditions.

FIG. 8 is a flowchart of a processing sequence of the OPC conditions generator 14, i.e., a sequence for generating OPC conditions.

For generating OPC conditions, a test pattern for use in generating OPC conditions is prepared in S401. It is assumed that the test pattern is made up of only layout parameters which satisfy DR formulated by the above DR formulating process. This is because a transistor having layout parameters limited against use by DR will not be used in the circuit of an actual semiconductor device, and it is inappropriate to establish OPC conditions with such a pattern.

After the test pattern has been prepared, the OPC conditions generator 14 sets certain OPC conditions as initial values in S402, predicts, by way of simulation, a shape to which the test pattern will be formed on a wafer, calculates electric characteristics of all transistors included in the test pattern, extracts a gate length distribution from a gate, and calculates electric characteristics of the gate from which the gate length distribution is extracted in S403. Then, the OPC conditions generator 14 calculates Lg* and determines Lg* with equivalent electric characteristics, and calculates an OPC condition evaluating index using the statistical value of the gate length distribution, the electric characteristics, and Lg* which have been calculated, in S404.

Thereafter, the OPC conditions generator 14 determines whether the established OPC conditions (e.g., initial values) are appropriate or not using the OPC condition evaluating index in S405. Specifically, the OPC conditions generator 14 determines whether the calculated OPC condition evaluating index is of an optimum value or not or matches given specifications or not. If the calculated OPC condition evaluating index is not of the optimum value or does not match the given specifications, then the OPC conditions generator 14 corrects the OPC conditions (e.g., changes from the initial values by a predetermined quantity) in S406. Thereafter, the loop (S403 through S406) is repeated. If the calculated OPC condition evaluating index is of the optimum value or matches the given specifications, then the OPC conditions generator 14 determines the OPC conditions based on which the OPC condition evaluating index has been calculated as optimum OPC conditions in S407.

The OPC condition evaluating index may be a single evaluating index (e.g., either the sum of deviations between the average values and respective values of Lg*_Vth, Lg*_Ion, Lg*_Ioff of all transistors or the sum of variations of gate length distributions). In this case, OPC conditions are specified based on whether they are appropriate with respect to the single OPC condition evaluating index or not. Specifically, OPC conditions are changed so that the single OPC condition evaluating index will be minimum (or maximum) until optimum OPC conditions are found.

Alternatively, a plurality of evaluating indexes may be used in combination. In this case, optimum OPC conditions may be found by performing multi-purpose optimization according to a known multi-purpose optimization process, for example.

In the above description, certain OPC conditions are used as initial values and a loop is repeated until optimum OPC conditions are found. However, OPC conditions may be generated by performing a process of calculating OPC condition evaluating indexes with respect to all OPC conditions expected in advance and selecting OPC conditions with a most desirable OPC condition evaluating index.

Though the number of iterations which the loop goes through is not specified here, the OPC conditions generator 14 shall have an algorithm, which iterative calculation processes of this type usually have, for calculating an OPC condition evaluating index within a preset number of iterations.

[Calculation of Lrep Coefficient]

For performing the OPC process, the OPC calculator 16 may employ a process of using Lg* determined by the above Lg* calculations for internal calculations and moving each edge or each segment so that the value of Lg* will reach a target value. However, the OPC process which uses Lg* is disadvantageous in that the calculation load tends to become excessively large.

For reducing the amount of calculations involved in the OPC process, the Lrep coefficient calculator 15 calculates a corrective coefficient for specifying the associated relationship between the statisitical value of gate length distributions of transistors and Lg*. The corrective coefficient will hereinafter be represented by "c_Lrep".

Using c_Lrep makes it possible to perform an OPC process for calculating a representative value Lrep of the gate length distribution of a transistor with less calculations than Lg* calculations, from the gate length distribution of the transistor, and moving each edge or each segment so that Lrep will become a target gate length, as described in detail later.

Figure 9:
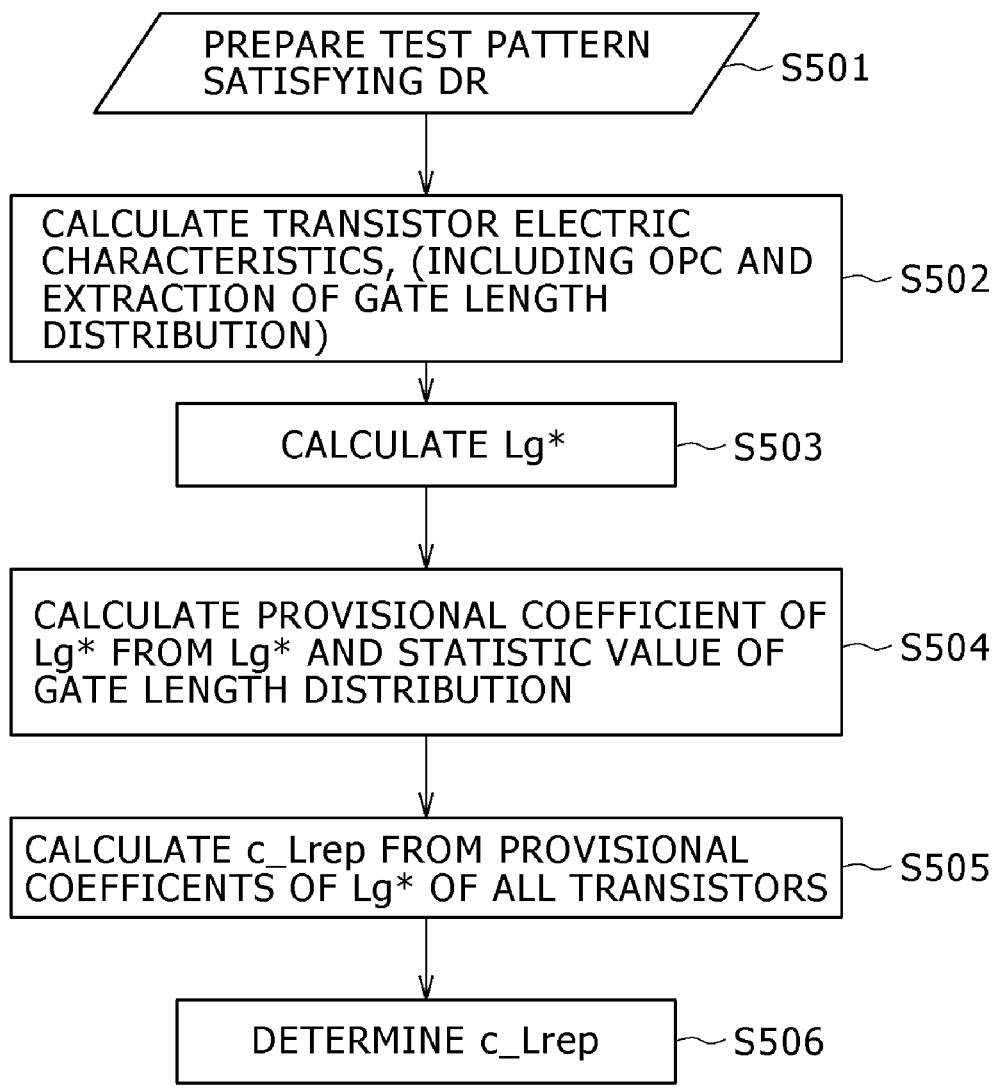
FIG. 9 is a flowchart of a sequence for calculating c_Lrep.

FIG. 9 is a flowchart of a processing sequence of the Lrep coefficient calculator 15, i.e., a sequence for calculating c_Lrep.

For calculating c_Lrep, a test pattern satisfying DR is prepared in the same manner as with the above generation of OPC conditions, in S501. The Lrep coefficient calculator 15 predicts, by way of simulation, a shape to which the test pattern will be formed on a wafer, calculates electric characteristics of all transistors included in the test pattern, extracts a gate length distribution from a gate, and calculates electric characteristics of the gate from which the gate length distribution is extracted in S502. Then, the Lrep coefficient calculator 15 calculates Lg* and determines Lg* with equivalent electric characteristics in S503. In other words, the Lrep coefficient calculator 15 calculates statistical values of gate length distributions, electric characteristics, and Lg* of all transistors in the test pattern.

Thereafter, the Lrep coefficient calculator 15 calculates provisional coefficients for determining Lg*_Vth, Lg*_Ion, and Lg*_Ioff from the statistical values of gate length distributions in S504. Specifically, the Lrep coefficient calculator 15 may calculate provisional coefficients according to the following equations (1) through (3):

Lg*_Vth=an average value of gate length distributions+a provisional coefficient of Lg*_Vth * a variation of gate length distributions    (1)

Lg*_Ion=an average value of gate length Distributions +a provisional coefficient of Lg*_Ion * a variation of gate length distributions    (2)

Lg*_Ioff=an average value of gate length Distributions +a provisional coefficient of Lg*_Ioff * a variation of gate length distributions    (3)

The above equations (1) through (3) are calculated with respect to all the transistors in the test pattern.

After having determined the provisional coefficients for determining Lg*_Vth, Lg*_Ion, and Lg*_Ioff, the Lrep coefficient calculator 15 calculates c_Lrep from the provisional coefficients with respect to all the transistors in S505, and determine c_Lrep based on the calculated results in S506.

If Lrep is to be determined with greater emphasis on Vth, i.e., if an OPC process is to be performed to reduce a variation of Vth, then the provisional coefficients for determining Lg*_Vth may be averaged for all the transistors, and the average value may be used as c_Lrep.

If equal attention is to be paid to all Lg*_Vth, Lg*_Ion, and Lg*_Ioff, i.e., if an OPC process is to be performed to reduce variations of all of Vth, Ion, and Ioff, then the provisional coefficients for determining Lg*_Vth, Lg*_Ion, and Lg*_Ioff may be averaged for all the transistors, and the average value may be used as c_Lrep.

Accordingly, c_Lrep may be determined using at least one of the calculated provisional coefficients which correspond to the different electric characteristics, i.e., Vth, Ion, and Ioff.

For calculating c_Lrep from a plurality of provisional coefficients, not only an average value is determined for all the transistors, but the provisional coefficients may be weighted based on the frequency rate of the layout parameters of an actual semiconductor device. For example, if transistors having a certain gate width occupy many data in a standard cell library used for designing semiconductor devices, then the provisional coefficients of layout parameters of the transistors occupy the many data are weighted to calculate c_Lrep. According to a numerical example, if transistors having a gate width of 500 nm occupy 90% of the data, then the provisional coefficients of the transistors having the gate width of 500 nm are weighted 10 times greater than the provisional coefficients of transistors having other gate widths.

The statistical values of gate length distributions used to calculate the provisional coefficients may be other than the average value and variation of the gate length distributions. In the above example, the average value and variation of the gate length distributions are used because they have more information of the gate length distributions than maximum and minimum values thereof. If it can be found that the electric characteristics of transistors and the statistical value of a particular gate length distribution are closely related to each other, then another statistical value, e.g., a median value, may be used.

If the electric characteristics of transistors are strongly affected by a certain layout parameter, then c_Lrep may be considered to be used as a function of the layout parameter or a reference table depending on the layout parameter. For example, if it is known that the length of a protrusion (e.g., "Ex1" in FIG. 1) of a gate layer pattern from an active layer pattern toward a contact hole overlap area greatly affects the shape of the gate pattern, then provisional coefficients are averaged for each length of Ex1 to calculate c_Lrep. In this case, c_Lrep may be used as a function of Ex1 (by applying a certain function, for example), or c_Lrep may be held in a table format for every range of Ex1 (by generating a reference table such that c_Lrep is "−0.231" if Ex1 is at least 100 nm but smaller than 200 nm).

[OPC Calculation]

Based on the above processing sequences of the components 11 through 15, the OPC calculator 16 performs the following OPC process. In the OPC process, the position of each segment is changed such that Lrep will have a specification value.

Figure 10:
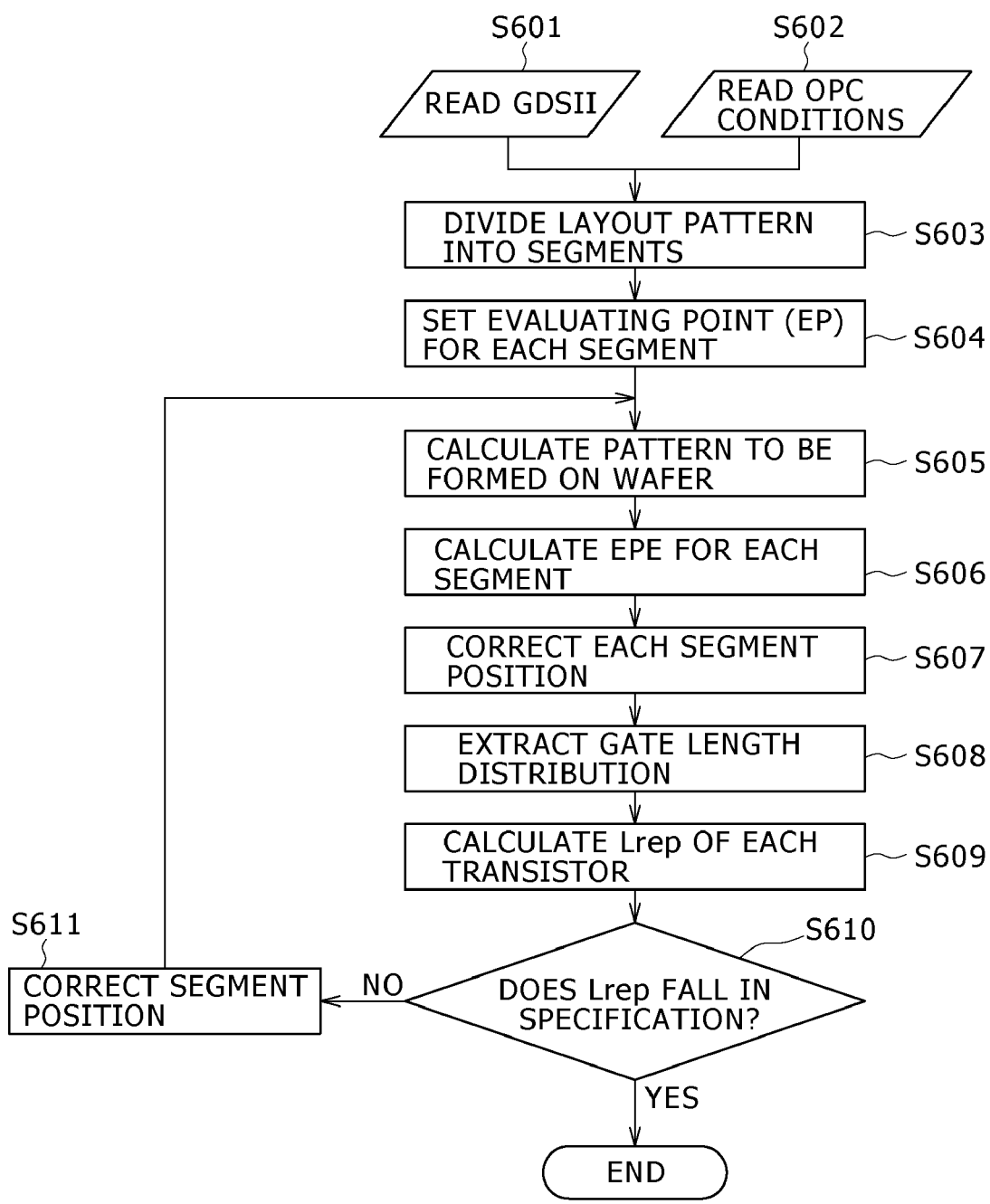
FIG. 10 is a flowchart of a sequence of an OPC process.
Figure 11:
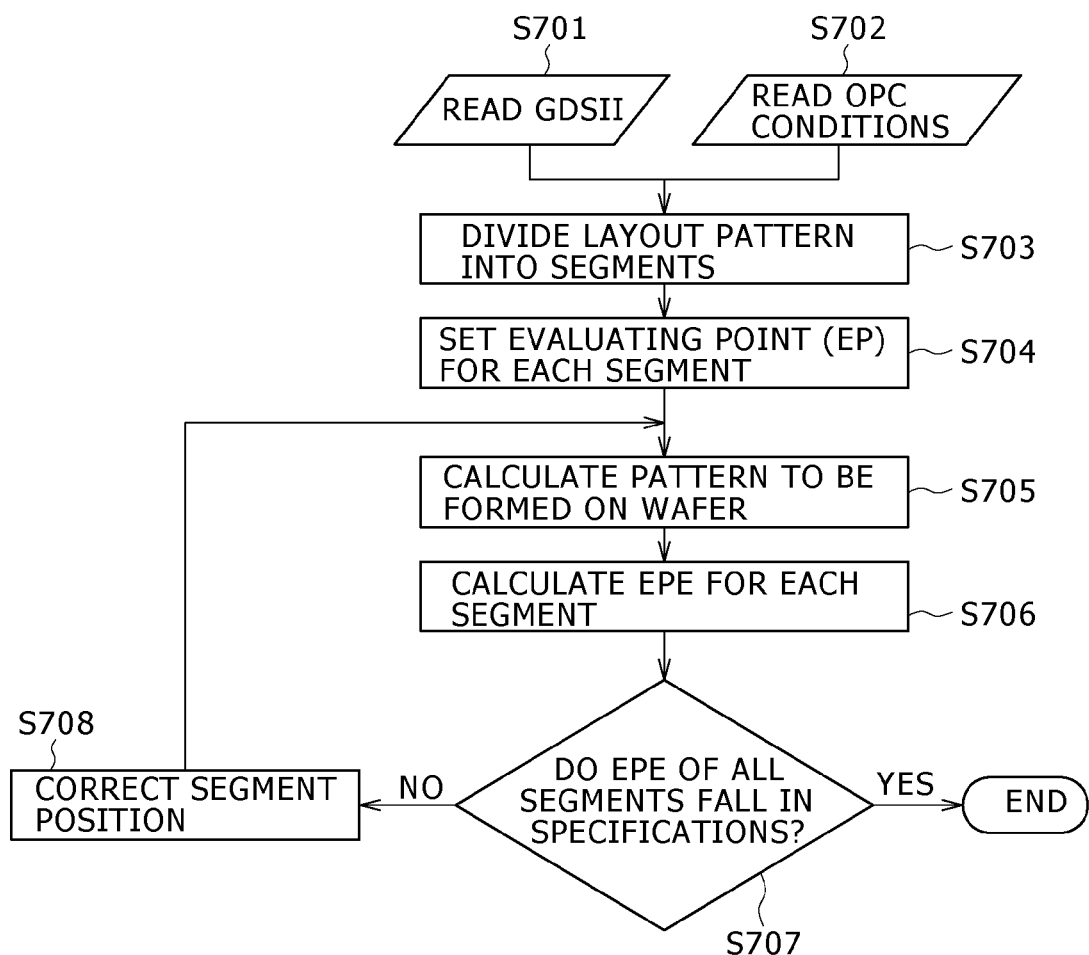
FIG. 11 is a flowchart of a sequence of an OPC process according to the related art.

FIG. 10 is a flowchart of a processing sequence of the OPC calculator 16, i.e., a sequence of OPC calculations.

In the OPC process performed by the OPC calculator 16, the OPC calculator 16 reads the GDSII data of a design pattern for a semiconductor device to be processed and OPC conditions obtained by the above OPC conditions generating process in S601, S602. Thereafter, the OPC calculator 16 divides the outer edge of a layout pattern of a circuit into segments in S603, and set an EP for each segment in S604. Then, the OPC calculator 16 calculates the position of a segment in the pattern formed on the wafer by way simulation in S605. The OPC calculator 16 calculates an EPE for each segment in S606, and changes the shape of the mask pattern to correct the EPE, thereby correcting the position of each segment in S607.

Thereafter, the OPC calculator 16 extracts a gate length distribution of each transistor in S608. The OPC calculator 16 calculates a gate length distribution representative value Lrep of each transistor using c_Lrep obtained by the above Lrep coefficient calculation from statistical values of the extracted gate length distributions in S609. Lrep corresponds to Lg* in each transistor. However, since Lrep is calculated using c_Lrep, it can be calculated with a smaller amount of calculations than if Lg* is calculated through the above Lg* calculations with respect to each transistor.

After having calculated Lrep, the OPC calculator 16 determines whether Lrep satisfies given specifications, i.e., falls in ±1 nm of the specification value, or not in S610. If Lrep satisfies given specifications, then the OPC process for the transistors is put to an end. If Lrep does not satisfy given specifications, then the position of each segment is corrected in S611, and thereafter the loop from S605 to S610 is repeated from the simulation of the formed pattern.

According to the OPC process performed by the OPC calculator 16, therefore, the pattern is corrected such that Lrep will be of the specification value.

It has been described above that if Lrep satisfies given specifications, then the OPC process for the transistors is put to an end. This is because if a layout pattern around a certain layout pattern changes during an exposing step or a processing step, a formed pattern changes even when the certain layout pattern does not change. Therefore, it is preferable to calculate Lrep until Lrep of all transistors satisfies the specifications even if segment positions are not changed in a certain transistor.

If Lrep does not satisfy the specifications, then the positions of all segments of the transistor may be corrected uniformly so that any variation of Lrep from a target value will be eliminated (become nil). Alternatively, a segment with a large EPE may be corrected in position by a distance greater than the variation of Lrep from a target value, and a segment with a small EPE may conversely be corrected in position by a distance smaller than the variation of Lrep from the target value.

For correcting segment positions, it is desirable to use an appropriate magnification (e.g., generally called MEF (Mask Error Factor) or MEEF (Mask Error Enhancement Factor)) for correcting the position of the mask pattern so that the formed pattern will change as targeted. The magnification, etc. may be determined according to the related art.

It should be understood by those skilled in the art that various modifications, combinations, sub-combinations and alternations may occur depending on design requirements and other factors insofar as they are within the scope of the appended claims or the equivalent thereof.

What is claimed is:

1. An optical proximity correction method of performing optical proximity correction on a design pattern for a semiconductor device including a transistor as a component thereof, said method comprising:
   a first step of extracting a gate length distribution of a gate from a pattern shape of the gate of a transistor to be formed on a wafer;
   a second step of calculating electric characteristics of the gate from which the gate length distribution has been extracted in the first step;
   a third step of determining a gate length of a rectangular gate having electric characteristics equivalent to the electric characteristics calculated in said second step;
   a fourth step of calculating a corrective coefficient for describing an associated relationship between a statistical value of the gate length distribution extracted in said first step and the gate length determined in said third step;
   a fifth step of extracting a gate length distribution of a gate of a transistor formed on the wafer by printing said design pattern, and calculating a gate length distribution representative value from the statistical value of the gate length distribution using the corrective coefficient calculated in said fourth step; and
   a sixth step of correcting said design pattern so that the gate length distribution representative value calculated in said fifth step will be a specification value;
   wherein steps one through six are performed by means of computer or an apparatus with a computer function.

2. The optical proximity correction method according to claim 1, wherein said fourth step calculates a plurality of provisional coefficients corresponding to different types of electric characteristics, and calculates said corrective coefficient using at least one of said provisional coefficients.

3. The optical proximity correction method according to claim 2, wherein said provisional coefficients are weighted before said corrective coefficient is calculated from said provisional coefficients.

4. An optical proximity correction apparatus with a computer function by means of which the apparatus can be configured to perform optical proximity correction on a design pattern for a semiconductor device including a transistor as a component thereof, when configured said apparatus comprising:
   first means for extracting a gate length distribution of a gate from a pattern shape of the gate of a transistor to be formed on a wafer;
   second means for calculating electric characteristics of the gate from which the gate length distribution has been extracted by the first means;
   third means for determining a gate length of a rectangular gate having electric characteristics equivalent to the electric characteristics calculated by said second means;
   fourth means for calculating a corrective coefficient for describing an associated relationship between a statistical value of the gate length distribution extracted by said first means and the gate length determined by said third means;
   fifth means for extracting a gate length distribution of a gate of a transistor formed on the wafer by printing said design pattern, and calculating a gate length distribution representative value from the statistical value of the gate length distribution using the corrective coefficient calculated by said fourth means; and
   sixth means for correcting said design pattern so that the gate length distribution representative value calculated by said fifth means will be a specification value.

5. A storage medium containing an optical proximity correction program of instructions, for a computer or apparatus with a computer function, for performing optical proximity correction on a design pattern for a semiconductor device including a transistor as a component thereof in which the computer or apparatus with a computer function is programmed to function as:
   first means for extracting a gate length distribution of a gate from a pattern shape of the gate of a transistor to be formed on a wafer;
   second means for calculating electric characteristics of the gate from which the gate length distribution has been extracted by the first means;
   third means for determining a gate length of a rectangular gate having electric characteristics equivalent to the electric characteristics calculated by said second means;
   fourth means for calculating a corrective coefficient for describing an associated relationship between a statistical value of the gate length distribution extracted by said first means and the gate length determined by said third means;
   fifth means for extracting a gate length distribution of a gate of a transistor formed on the wafer by printing said design pattern, and calculating a gate length distribution representative value from the statistical value of the gate length distribution using the corrective coefficient calculated by said fourth means; and sixth means for correcting said design pattern so that the gate length distribution representative value calculated by said fifth means will be a specification value.

6. A method of manufacturing a semiconductor device including a transistor as a component thereof by means of an optical proximity correction process on a design pattern for the semiconductor device, said optical proximity correction process comprising:

a first step of extracting a gate length distribution of a gate from a pattern shape of the gate of a transistor to be formed on a wafer;

a second step of calculating electric characteristics of the gate from which the gate length distribution has been extracted in the first step;

a third step of determining a gate length of a rectangular gate having electric characteristics equivalent to the electric characteristics calculated in said second step;

a fourth step of calculating a corrective coefficient for describing an associated relationship between a statistical value of the gate length distribution extracted in said first step and the gate length determined in said third step;

a fifth step of extracting a gate length distribution of a gate of a transistor formed on the wafer by printing said design pattern, and calculating a gate length distribution representative value from the statistical value of the gate length distribution using the corrective coefficient calculated in said fourth step; and a sixth step of correcting said design pattern so that the gate length distribution representative value calculated in said fifth step will be a specification value;

wherein steps one through six are performed by means of computer or an apparatus with a computer function.

7. An optical proximity correction apparatus programmed to execute optical proximity correction on a design pattern for a semiconductor device including a transistor as a component thereof, comprising:

a first section configured to extract a gate length distribution of a gate from a pattern shape of the gate of a transistor to be formed on a wafer;

a second section configured to calculate electric characteristics of the gate from which the gate length distribution has been extracted by the first section;

a third section configured to determine a gate length of a rectangular gate having electric characteristics equivalent to the electric characteristics calculated by said second section;

a fourth section configured to calculate a corrective coefficient for describing an associated relationship between a statistical value of the gate length distribution extracted by said first section and the gate length determined by said third section;

a fifth section configured to extract a gate length distribution of a gate of a transistor formed on the wafer by printing said design pattern, and to calculate a gate length distribution representative value from the statistical value of the gate length distribution using the corrective coefficient calculated by said fourth section; and a sixth section configured to correct said design pattern so that the gate length distribution representative value calculated by said fifth section will be a specification value.

* * * * *